(12) United States Patent
Hashiguchi et al.

(10) Patent No.: US 10,667,383 B2
(45) Date of Patent: May 26, 2020

(54) PRINTED CIRCUIT BOARD AND SWITCHING POWER SUPPLY FOR ELECTRONIC APPLIANCE

(71) Applicant: Rohm Co., Ltd., Kyoto (JP)

(72) Inventors: Shingo Hashiguchi, Kyoto (JP); Shoichi Harada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/581,098

(22) Filed: Sep. 24, 2019

(65) Prior Publication Data

US 2020/0022253 A1 Jan. 16, 2020

Related U.S. Application Data

(63) Continuation of application No. 15/912,907, filed on Mar. 6, 2018, now Pat. No. 10,470,295.

(30) Foreign Application Priority Data

Mar. 7, 2017 (JP) .................. 2017-042891

(51) Int. Cl.
*H05K 1/02* (2006.01)
*H01L 27/02* (2006.01)
*H03K 17/16* (2006.01)
*G05F 1/10* (2006.01)

(52) U.S. Cl.
CPC ............ *H05K 1/0236* (2013.01); *G05F 1/10* (2013.01); *H01L 27/0207* (2013.01); *H03K 17/161* (2013.01); *H05K 1/0234* (2013.01); *H05K 1/0231* (2013.01); *H05K 2201/10053* (2013.01)

(58) Field of Classification Search
CPC ........... H02M 3/24; H02M 1/34; H01L 29/00; H01L 25/52; H01L 25/525; H05K 1/01; H05K 1/15; H05K 1/161
USPC .......................... 361/777–784, 803; 363/20
See application file for complete search history.

(56) References Cited

U.S. PATENT DOCUMENTS 8,547,681 B2 * 10/2013 Logan .................... H01G 5/011
 361/301.2
8,944,335 B2 * 2/2015 Dokai .................. H01Q 1/2208
 235/492
9,000,559 B2 * 4/2015 Ueda .................. H01L 23/5256
 257/529
9,570,972 B2 * 2/2017 Kanda ..................... H02M 1/34
(Continued)

FOREIGN PATENT DOCUMENTS

JP 5779213 7/2015

*Primary Examiner* — Tuan T Dinh
(74) *Attorney, Agent, or Firm* — Fish & Richardson P.C.

(57) ABSTRACT

A printed circuit board has: a first wiring pattern laid in a first layer such that, when a predetermined component is mounted in a predetermined mounting region, a first current path in an open ring shape leading from a first end to a second end is formed; a second wiring pattern laid in a second layer different from the first layer such that a second current path in an open ring shape leading from a third end to a fourth end is formed; a first conductive member formed between the second and third ends; and a second conductive member formed between the first and fourth ends. The first and second wiring patterns are so laid that, as seen in their respective plan views, the directions of the currents flowing across the first and second current paths, respectively, are opposite to each other.

16 Claims, 17 Drawing Sheets

(56) References Cited

U.S. PATENT DOCUMENTS

| | | |
|---|---|---|
| 2008/0247195 A1 | 10/2008 | Nakahori |
| 2009/0160719 A1* | 6/2009 | Kato ................ G06K 19/07749 343/742 |
| 2012/0300522 A1* | 11/2012 | Tokuyama ............ H01L 25/072 363/131 |
| 2014/0111174 A1 | 4/2014 | Shtargot et al. |
| 2015/0155086 A1 | 6/2015 | Matsuura |
| 2018/0191260 A1 | 7/2018 | Kikuchi |

\* cited by examiner

PRINTED CIRCUIT BOARD AND SWITCHING POWER SUPPLY FOR ELECTRONIC APPLIANCE This application is a continuation of U.S. application Ser. No. 15/912,907, filed Mar. 6, 2018, which is based on Japanese Patent Application No. 2017-042891 filed on Mar. 7, 2017, the contents of which are hereby incorporated by reference.

BACKGROUND OF THE INVENTION

1. Field of the Invention

The invention disclosed herein relates to printed circuit boards, and to switching power supplies employing printed circuit boards.

2. Description of Related Art

A switching power supply includes a path in which an abrupt change in current occurs as a result of the on/off control of a switching output stage. The path generally has a capacitance component and an inductance component; thus, ringing occurs due to LC resonance, and this causes EMI (electromagnetic interference) radiation noise (switching noise) to be emitted to the outside.

FIG. 16 is a diagram showing a first conventional example of a switching power supply. The switching power supply of this conventional example has, on a printed circuit board 200, a bypass capacitor C10 disposed near a semiconductor device U10 (controller IC).

To be sure, with this circuit board layout, it is possible to reduce the parasitic capacitance component Lx that accompanies the wiring pattern and to reduce the path in which an abrupt change in current occurs (that is, the input loop that leads from the first terminal of the bypass capacitor C10 via high-side and low-side switches QH and QL inside the semiconductor device U10 back to the second terminal of the bypass capacitor C10), and thus it is possible to weaken the magnetic field that occurs in the input loop (in the illustrated example, the magnetic field that points from the near side to the far side of the plane of the diagram). Inconveniently, with this approach against EMI, there is a limit to shortening the distance between the bypass capacitor C10 and the semiconductor device U10, and it is not possible to completely eliminate the magnetic field that occurs in the input loop.

FIG. 17 is a diagram showing a second conventional example of a switching power supply. The switching power supply of this conventional example is proposed in Japanese Patent registered as No. 5779213, and has, inside a semiconductor device U20, high-side and low-side switches QH and QL each split into two parts, namely high-side switches QH1 and QH2 and low-side switches QL1 and QL2 respectively so that a pair of input loops around which currents flow in mutually opposite directions is provided symmetrically left to right in the same layer. In this configuration, the magnetic fields that occur in those input loops respectively cancel (neutralize) each other.

To be sure, with this conventional technology, it is possible to cancel the magnetic fields in the direction perpendicular to the plane of the diagram, and it is thus possible to reduce the EMI radiation noise emitted outside the switching power supply. Inconveniently, with this approach against EMI, two bypass capacitors C21 and C22 are required, and this leads to an unnecessary increase in cost. Also inconveniently, with the above-mentioned pair of input loops, the magnetic fields to cancel each other are disposed away from each other across the semiconductor device U20, and thus those magnetic fields are not eliminated completely.

On the other hand, according to one conventionally known approach against EMI, spectrum spreading is applied to the driving frequency of a switching power supply. Inconveniently, spectrum spreading has only a limited effect in suppressing EMI radiation noise, and does not provide a thorough approach against EMI.

SUMMARY OF THE INVENTION

In view of the problems encountered by the present inventors, an object of the invention disclosed herein is to provide a printed circuit board that can reduce EMI radiation noise from a switching power supply, and to provide a switching power supply employing such a printed circuit board.

According to one aspect of what is disclosed herein, a printed circuit board includes: a first wiring pattern which is laid in a first layer such that, when a predetermined component is mounted in a predetermined mounting region, a first current path in the shape of an open ring that leads from a first end to a second end is formed; a second wiring pattern which is laid in a second layer, which is different from the first layer, such that a second current path in the shape of an open ring that leads from a third end to a fourth end is formed; a first conductive member which is formed between the second end and the third end; and a second conductive member which is formed between the first end and the fourth end. Here, the first and second wiring patterns are so laid that, as seen in their respective plan views, the direction of the current that flows across the first current path and the direction of the current that flows across the second current path are opposite to each other.

Other features, elements, steps, benefits, and characteristics of the present invention will become clearer with reference to the following description of preferred embodiments thereof in conjunction with the accompanying drawings.

DETAILED DESCRIPTION OF PREFERRED EMBODIMENTS

Figure 1:
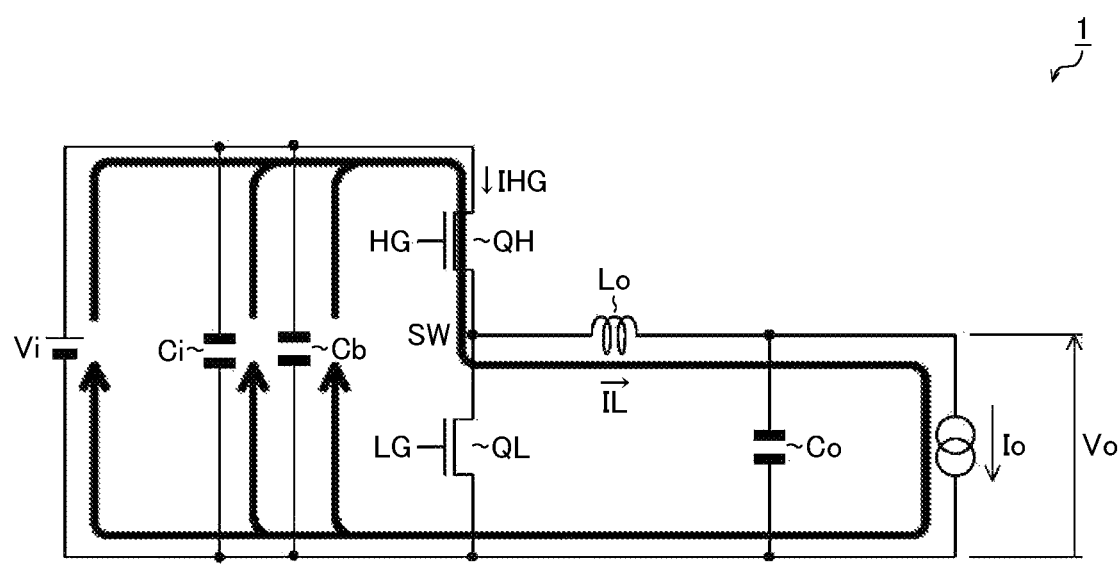
FIG. 1 is a diagram showing a configuration of a principal part of a switching power supply (with a high-side switch on)
Figure 2:
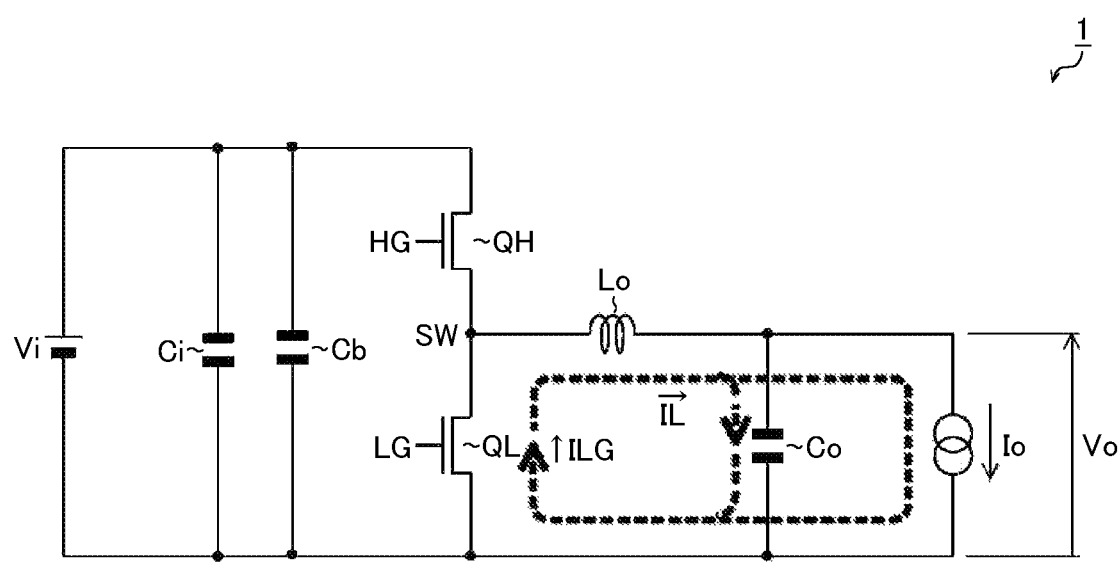
FIG. 2 is a diagram showing a configuration of a principal part of a switching power supply (with a high-side switch off)
Figure 3:
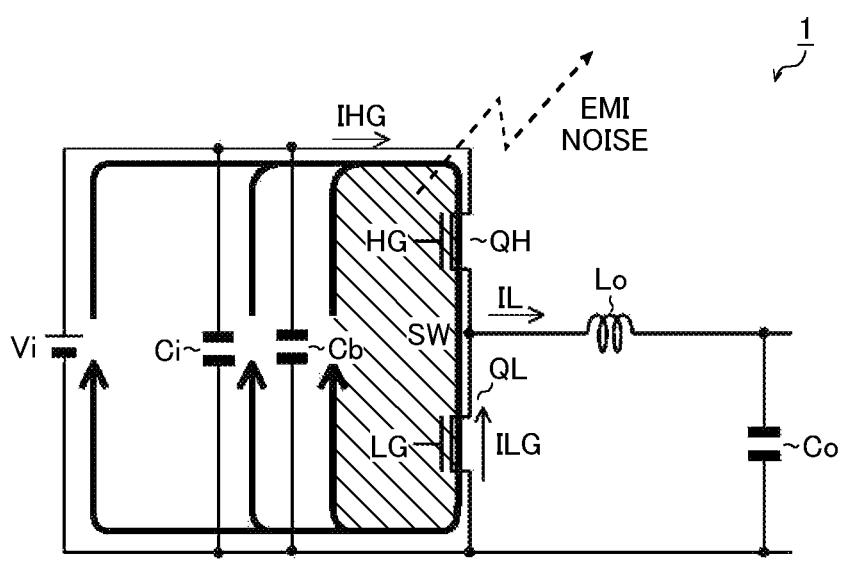
FIG. 3 is a diagram showing a configuration of a principal part of a switching power supply (a differential current)

Switching Power Supply: FIGS. 1 to 3 are diagrams each showing a configuration of a principal part of a switching power supply. FIG. 1 shows a path across which a high-side switching current IHG flows, and FIG. 2 shows a path across which a low-side switching current ILG flows. FIG. 3 shows a differential current (=IHG−ILG) between the high-side and low-side switching currents IHG and ILG.

As shown in FIGS. 1 to 3, the switching power supply 1 of this configuration example is a step-down DC/DC converter that includes a high-side switch QH and a low-side switch QL (in the illustrated example, both are N-channel power MOSFETs (metal-oxide-semiconductor field-effect transistors)), an input capacitor Ci, an output capacitor Co, a bypass capacitor Cb, and an output coil Lo, and that generates from an input voltage Vi a desired output voltage Vo to supply it to a load. The load is anything that is incorporated along with the switching power supply 1 in various kinds of electronic appliances, and operates by being fed with direct-current power (the output voltage Vo and an output current Io) from the switching power supply 1.

In the switching power supply 1 of this configuration example, the high-side and low-side switches QH and QL, which constitute a switching output stage, are controlled to turn on and off complementarily with a high-side gate signal HG and a low-side gate signal LG respectively. In the present specification, "complementarily" covers not only operation where the on/off states of the high-side and low-side switches QH and QL are completely reversed but also operation where periods (dead time) in which the high-side and low-side switches QH and QL are simultaneously off are reserved.

Through the on/off control described above, a switching voltage SW with a square waveform that is pulse-driven between the input voltage Vi and a ground voltage GND appears at the connection node between the high-side and low-side switches QH and QL. The output coil Lo and the output capacitor Co function as an LC filter that rectifies and smooths the switching voltage SW to generate the output voltage Vo.

Figure 4:
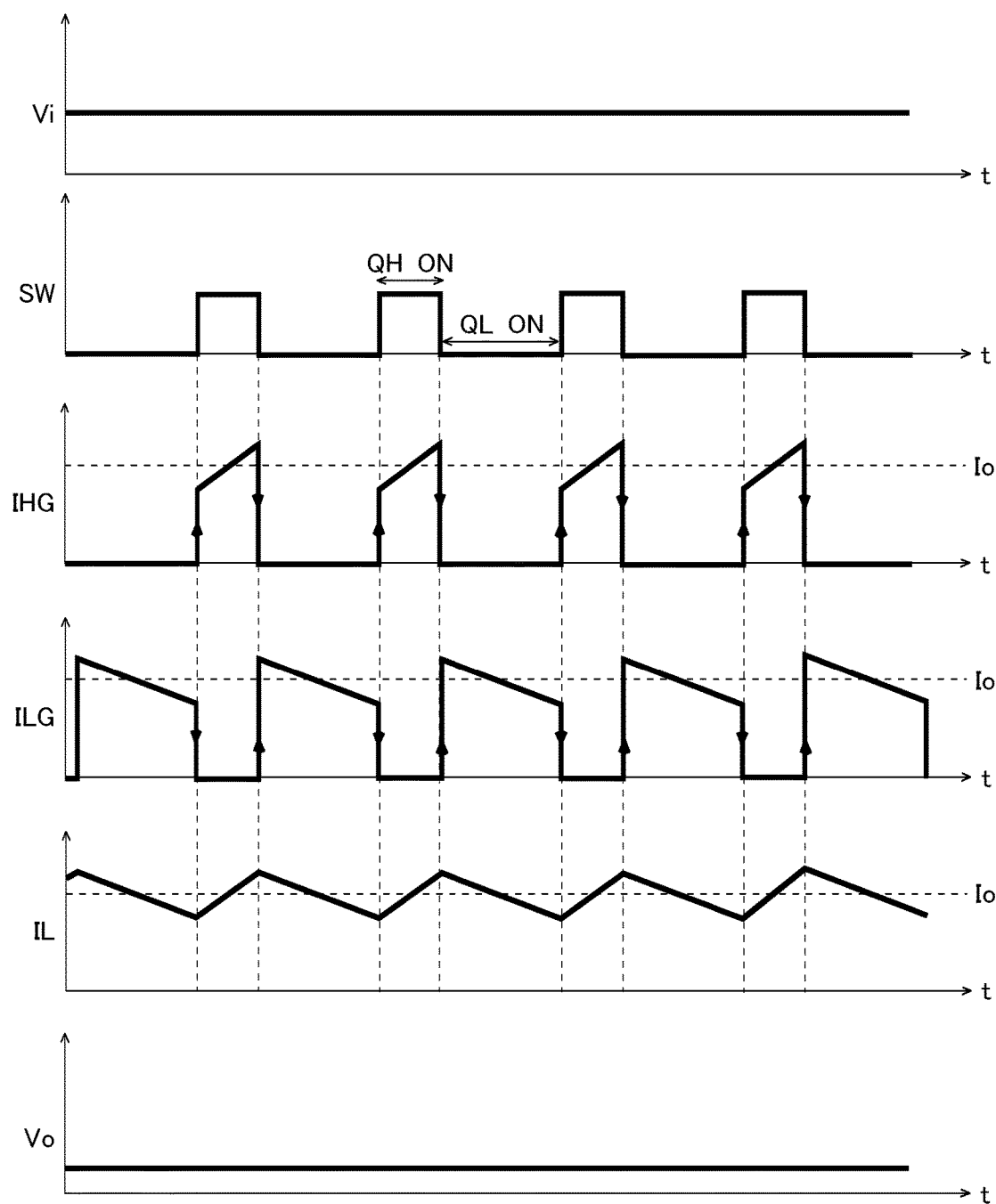
FIG. 4 is a diagram showing voltages and currents at relevant points in a switching power supply.

FIG. 4 is a diagram showing voltages and currents at relevant points in the switching power supply 1, depicting, from top down, the input voltage Vi, the switching voltage SW, the high-side switching current IHG, the low-side switching current ILG, a coil current IL, and the output voltage Vo.

As illustrated, in the high-level period of the switching voltage SW (with QH on and QL off), the high-side switching current IHG (and hence the coil current IL and the output current Io) flows across a current path (see FIG. 1) via the high-side switch QH. On the other hand, in the low-level period of the switching voltage SW (with QH off and QL on), the low-side switching current ILG (and hence the coil current IL and the output current Io) flows across the current path (see FIG. 2) via the low-side switch QL.

Thus, the switching power supply 1 includes a path in which an abrupt change in current occurs as a result of the on/off control of the high-side and low-side switches QH and QL. In particular, the input loop via the bypass capacitor Cb (the hatched region in FIG. 3) acts as a source of EMI radiation noise.

Figure 5:
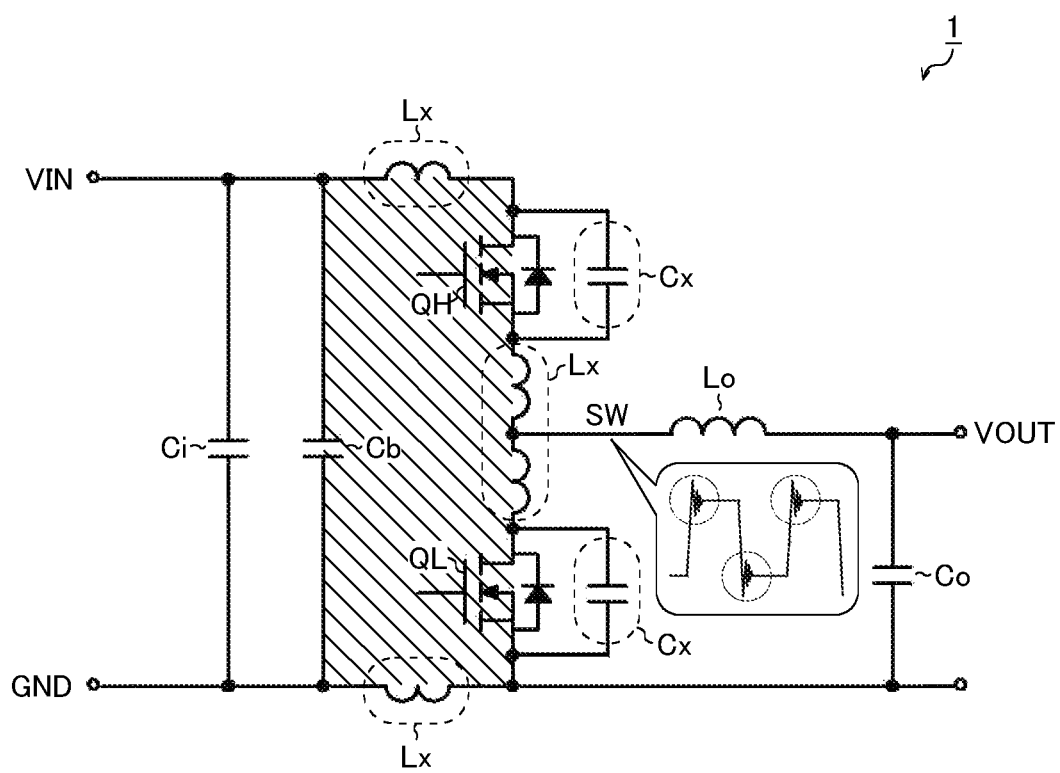
FIG. 5 is a diagram illustrating the principle of how EMI radiation noise occurs.

FIG. 5 is a diagram illustrating the principle of how EMI radiation noise occurs. As illustrated, the wiring of the input loop (see the hatched region in the diagram) via the bypass capacitor Cb is accompanied by a parasitic inductance component Lx of about 1 nH per millimeter. Moreover, the drain-source channel of each of the high-side and low-side switches QH and QL is accompanied by a parasitic capacitance component Cx. On the other hand, the on/off transition period of each of the high-side and low-side switches QH and QL (and hence the rise time and the fall time of the switching voltage SW) is about several nanoseconds (V=L× dI/dt, I=C×dV/dt).

Accordingly, as indicated in a balloon in the diagram, when the switching voltage SW rises and falls, severe ringing occurs due to LC resonance (at a resonance frequency $f=1/2\pi\sqrt{LC}$). This causes EMI radiation noise to be emitted outside the switching power supply 1.

To follow is a detailed description of a printed circuit board (and a method of patterning on it in particular) that allows effective suppression of the EMI radiation noise mentioned above.

Figure 6:
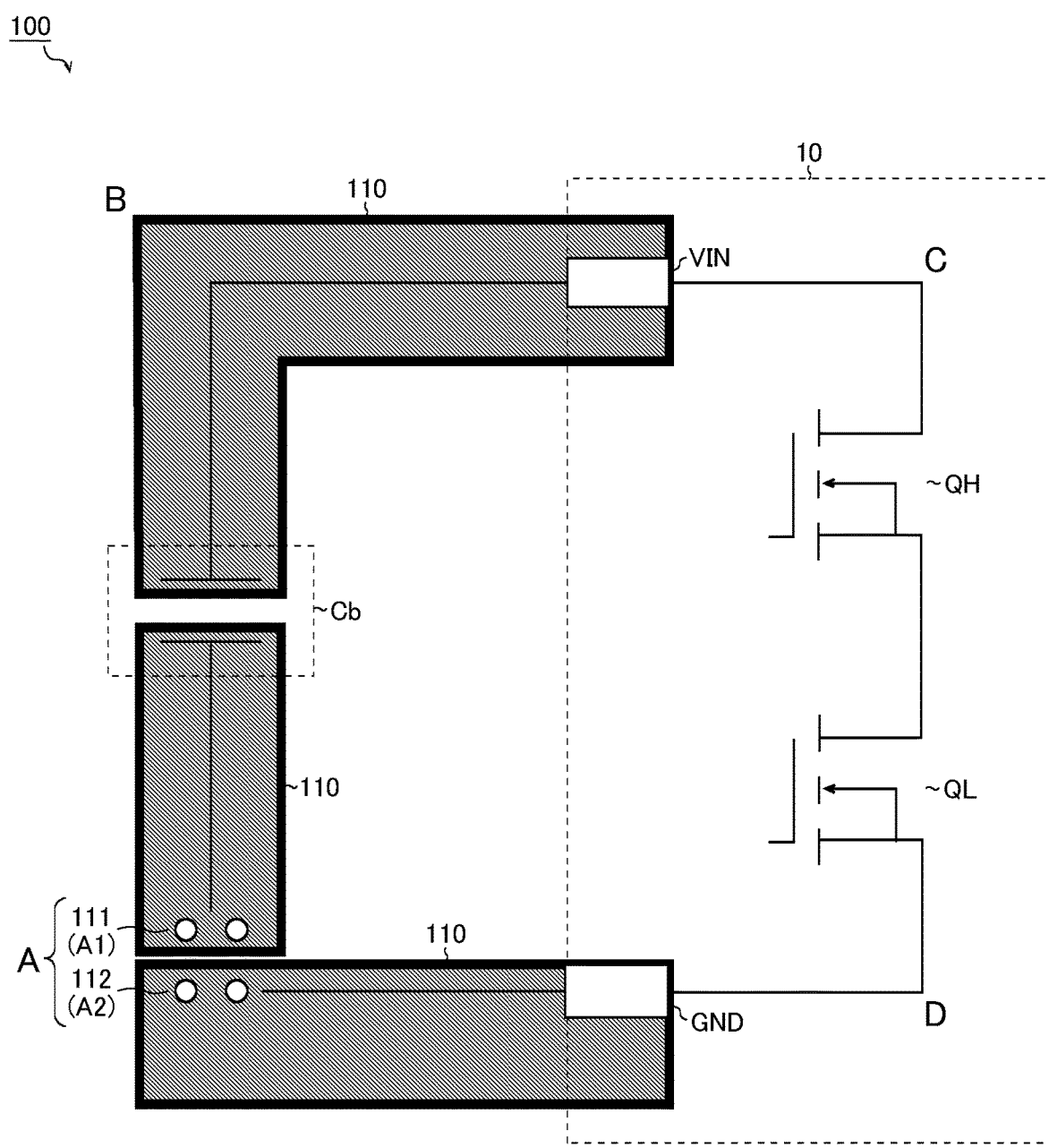
FIG. 6 is a diagram showing a planar layout of a first wiring pattern.
Figure 7:
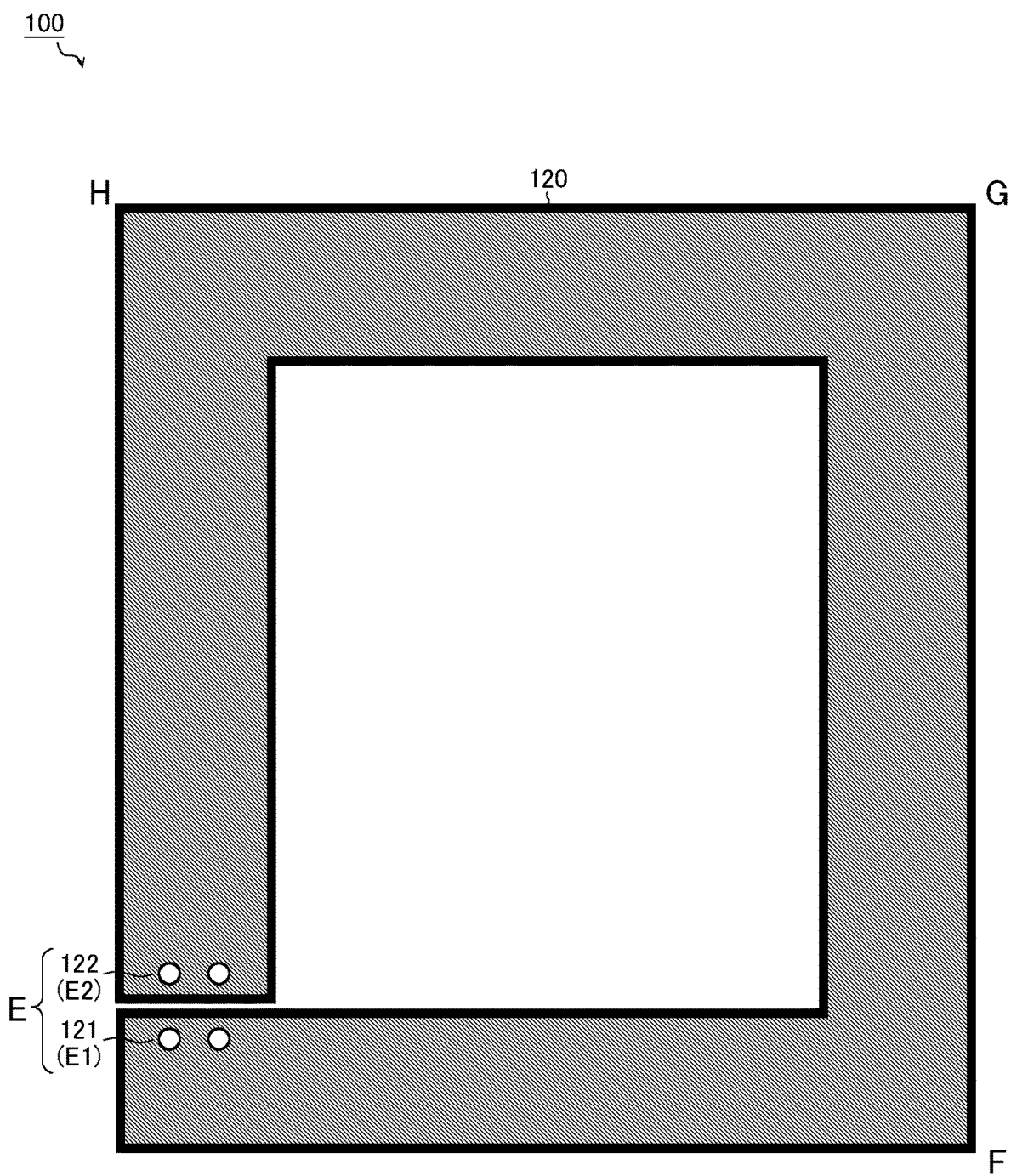
FIG. 7 is a diagram showing a planar layout of a second wiring pattern.
Figure 8:
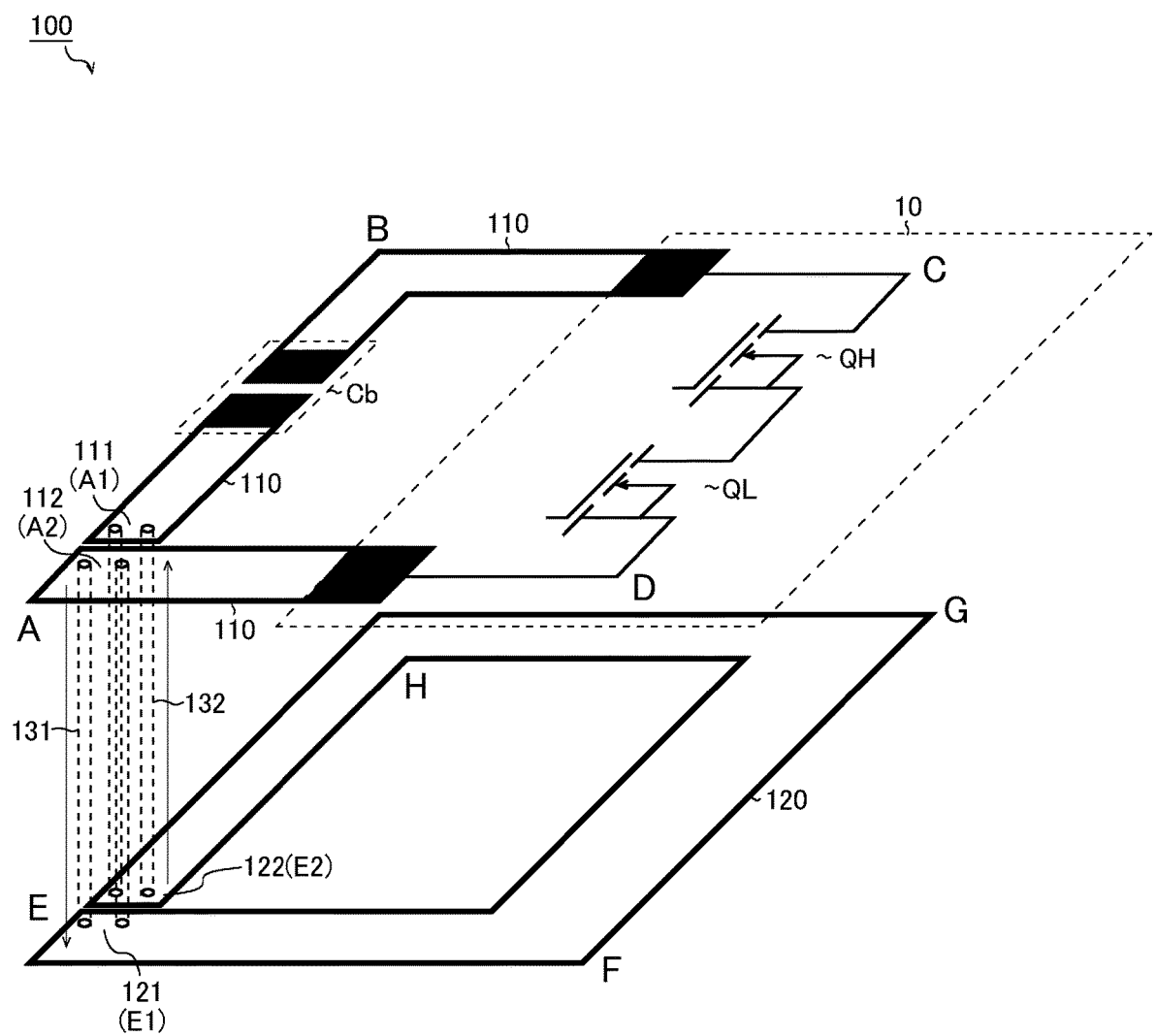
FIG. 8 is a diagram showing a spatial layout of a 3D wiring pattern.
Figure 9:
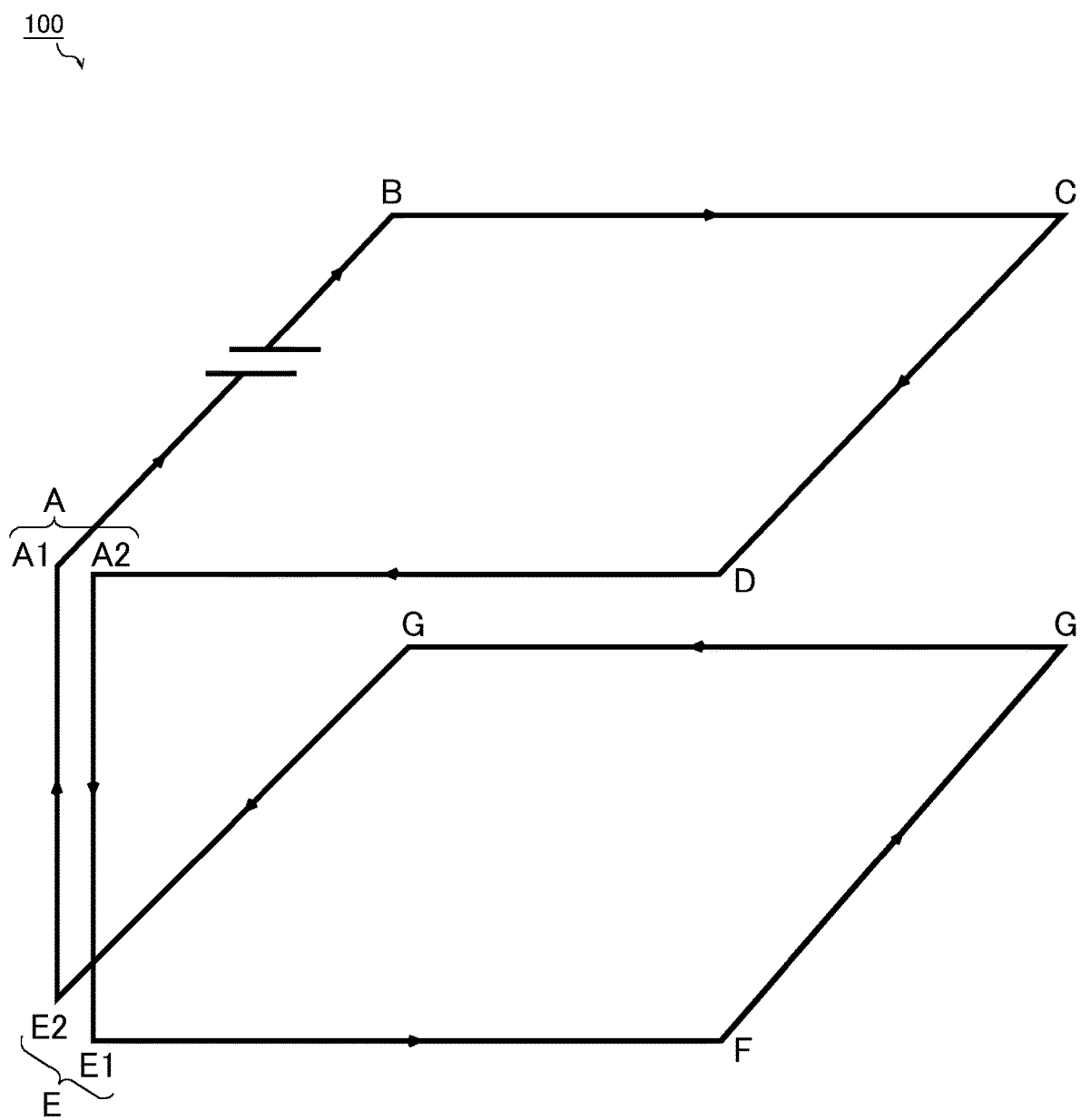
FIG. 9 is a diagram showing the direction of a current flowing across a 3D wiring pattern.

Printed Circuit Board: FIGS. 6 to 9 are diagrams showing one configuration example of a printed circuit board 100 that employs a novel circuit board layout devised to suppress EMI radiation noise. FIG. 6 depicts a planar layout of a first wiring pattern 110 in a first layer in the printed circuit board 100. FIG. 7 depicts a planar layout of a second wiring pattern 120 in a second layer in the printed circuit board 100. FIG. 8 depicts a spatial layout of a 3D wiring pattern which is the combination of the first and second wiring patterns 110 and 120. FIG. 9 depicts exclusively the direction of a current that flows across the 3D wiring pattern.

First, with reference to FIG. 6, the planar layout of the first wiring pattern 110 will be described. The first wiring pattern 110 is laid in a first layer (that is, the top layer on the obverse side of the circuit board, where components are mounted) such that, when predetermined components (in the illustrated example, a semiconductor device 10 having the high-side and low-side switches QH and QL integrated together, and the bypass capacitor Cb) are mounted in a predetermined mounting region (indicated by a broken-line box in the diagram), a first current path in the shape of an open ring that leads from a first end 111 to a second end 112 is formed, with the first and second ends 111 and 112 located next to each other.

In the illustrated example, the first wiring pattern 110 is separated into three segments (a first segment laid between the first terminal of the bypass capacitor Cb and a power terminal VIN of the semiconductor device 10, a second segment laid between the first end 111 and the second terminal of the bypass capacitor Cb, and a third segment laid between the second end 112 and a ground terminal GND of the semiconductor device 10), and these segments are as a whole disposed in the shape of the letter "C".

Next, with reference to FIG. 7, the planar layout of the second wiring pattern 120 will be described. The second wiring pattern 120 is laid in a second layer (an intermediate layer inside the circuit board, or the bottom layer on the reverse side of the circuit board), which is different from the first layer, such that a second current path in the shape of an open ring that leads from a third end 121 to a fourth end 122 is formed, with the third and fourth ends 121 and 122 located next to each other.

Next, with reference to FIG. 8, the spatial layout of the 3D wiring pattern which is the combination of the first and second wiring patterns 110 and 120 will be described. As indicated by broken lines in the diagram, between the second end 112 of the first wiring pattern 110 and the third end 121 of the second wiring pattern 120, a first conductive member 131 is formed to electrically connect them together. Likewise, between the first end 111 of the first wiring pattern 110 and the fourth end 122 of the second wiring pattern 120, a second conductive member 132 is formed to electrically connect them together. The first and second conductive members 131 and 132 can each be formed using an interlayer via hole or an intermediate layer.

The first and second wiring patterns 110 and 120 are laid such that, as seen in their respective plan views, at least part of a first region (see face ABCD in FIG. 9) surrounded by the first current path overlaps at least part of a second region (see face EFGH in FIG. 9) surrounded by the second current path. In the illustrated example in particular, the second wiring pattern 120 and the first wiring pattern 110 are laid parallel to each other such that the above-mentioned first and second regions overlap completely.

Moreover, in the illustrated example, the third end 121 of the second wiring pattern 120 is located right under (or generally right under) the second end 112 of the first wiring pattern 110, and the first conductive member 131 which electrically connects them together is formed in a straight line (or generally in a straight line). Likewise, the fourth end 122 of the second wiring pattern 120 is located right under (or generally right under) the first end 111 of the first wiring pattern 110, and the second conductive member 132 which electrically connects them together is formed in a straight line (or generally in a straight line).

Next, with reference to FIG. 9, the direction of the current that flows across the 3D wiring pattern will be described. The vertices A to H of the hexahedron shown in the diagram correspond to the parts indicated by the signs A to H in FIGS. 6 to 8.

Vertex A can be considered separately for vertex A1 corresponding to the first end 111 and vertex A2 corresponding to the second end 112. Vertex E can be considered separately for vertex E1 corresponding to the third end 121 and vertex E2 corresponding to the fourth end 122.

As illustrated, the current that flows across the 3D wiring pattern in the printed circuit board 100 (that is, the differential current between the high-side and low-side currents IHG and ILG in FIG. 3) flows in the direction from vertex A (vertex A1) to vertex B to vertex C to vertex D to vertex A (vertex A2) to vertex E (vertex E1) to vertex F to vertex G to vertex H to vertex E (vertex E2) to vertex A (vertex A1).

That is, the first and second wiring patterns 110 and 120 are laid such that, as seen in their respective plan views, the direction of the current that flows across the first current path (clockwise, i.e., from vertex A (vertex A1) to vertex B to vertex C to vertex D to vertex A (vertex A2)) and the direction of the current that flows across the second current path (counter-clockwise, i.e., from vertex E (vertex E1) to vertex F to vertex G to vertex H to vertex E (vertex E2)) are opposite to each other.

To follow is a specific description of the effect of the above-described 3D wiring pattern in cancelling magnetic fields, discussed separately for each of a plurality of locations.

Figure 10:
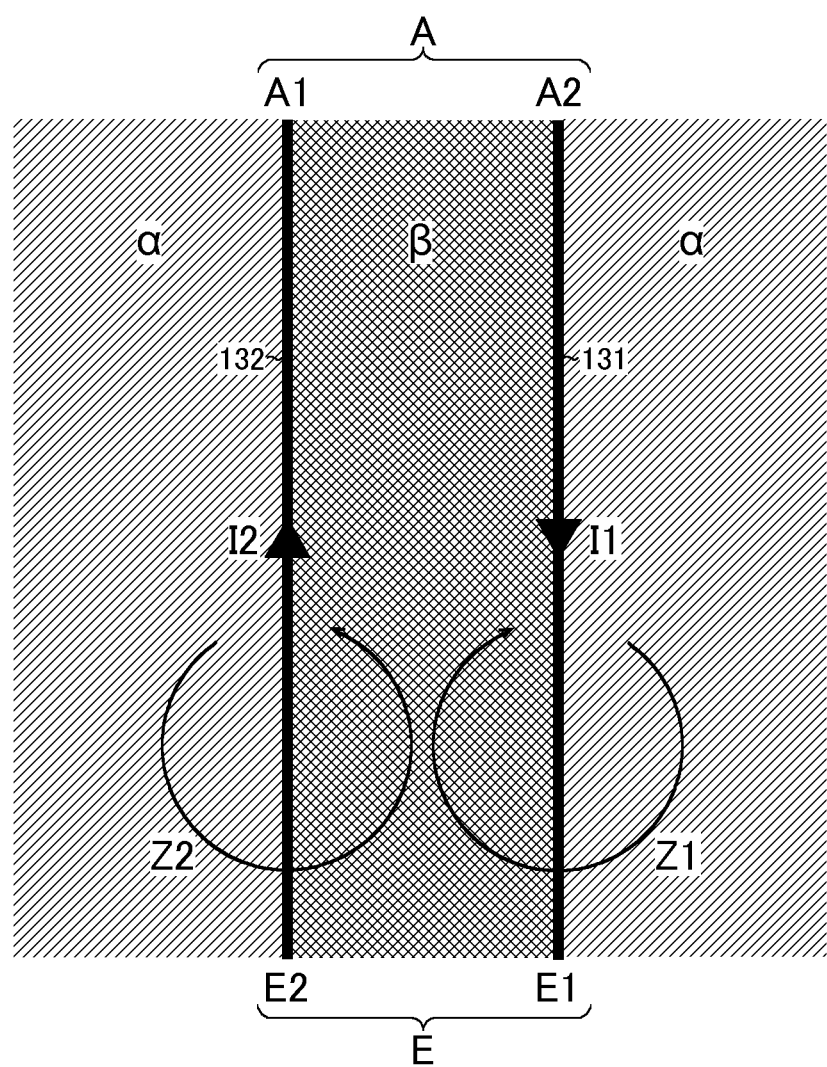
FIG. 10 is a diagram showing a magnetic field canceling effect (with no twist) at side AE.

Magnetic Field Canceling Effect: FIG. 10 is a diagram showing the magnetic field canceling effect (with no twist) at side AE (showing side AE as seen from a side of the first wiring pattern 110). As illustrated, the current I1 that flows across the first conductive member 131 from the second end A2 (112) to the third end E1 (121) and the current I2 that flows across the second conductive member 132 from the fourth end E2 (122) to the first end A1 (111) flow in mutually opposite directions.

Thus, in region α (that is, elsewhere than in region β located between the first and second conductive members 131 and 131), the magnetic field Z1 that occurs around the current I1 and the magnetic field Z2 that occurs around the current I2 cancel each other. This produces a magnetic field canceling effect at side AE.

In region β, the magnetic fields Z1 and Z2 act to boost each other. However, the first and second conductive members 131 and 132 are laid parallel to each other at an extremely close distance from each other, and thus region β is an extremely limited region. Accordingly, it can safely be said that the magnetic fields Z1 and Z2 are canceled nearly completely.

Figure 11:
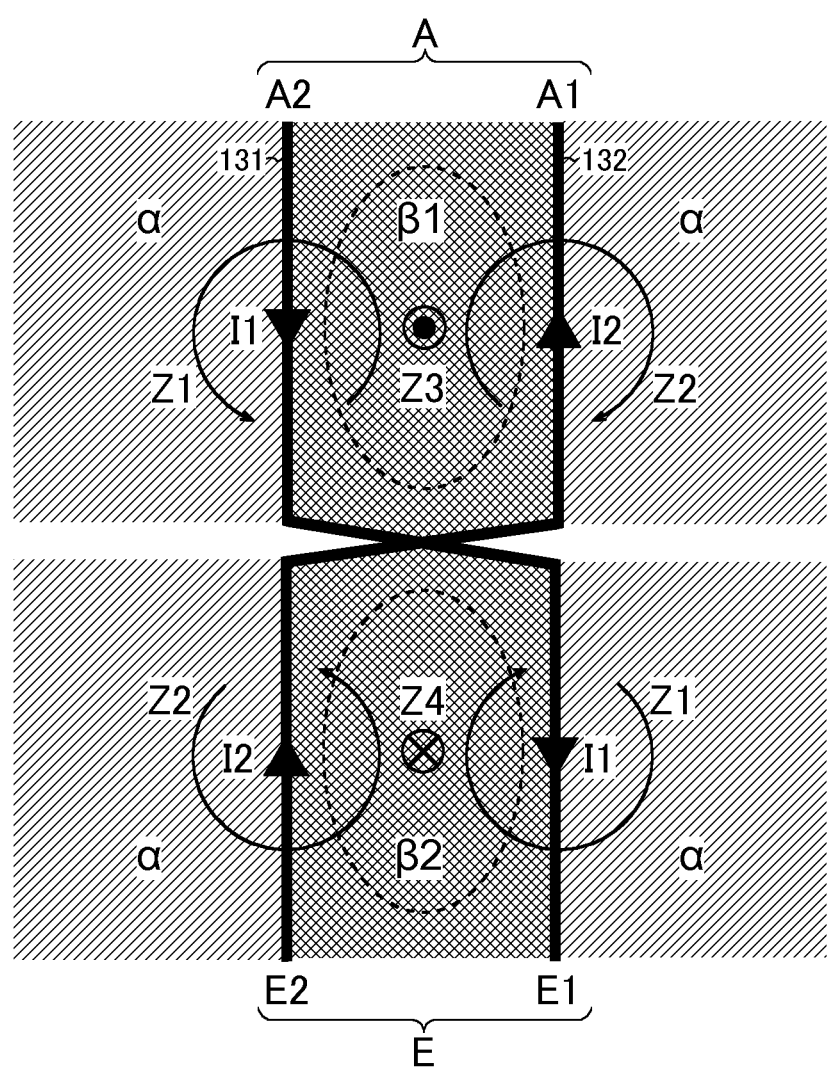
FIG. 11 is a diagram showing a magnetic field canceling effect (with a twist) at side AE.

FIG. 11 is a diagram showing the magnetic field canceling effect (with a twist) at side AE. In the illustrated example, the first and second conductive members 131 and 132 are twisted around each other like a twisted-pair communication cable. Such a twisted structure can easily be obtained using an interlayer via hole and an intermediate layer (that is, at least one layer provided between the first and second layers).

Owing to the above-described twisted structure, the magnetic field Z3 (in the illustrated example, the magnetic field pointing from the far side to the near side of the plane of the diagram) boosted in region β1 and the magnetic field Z4 (in the illustrated example, the magnetic field pointing from the near side to the far side of the plane of the diagram) boosted in region β2 cancel each other. This produces a stronger magnetic field canceling effect and, ideally, makes it possible to completely cancel the magnetic fields at side AE.

Figure 12:
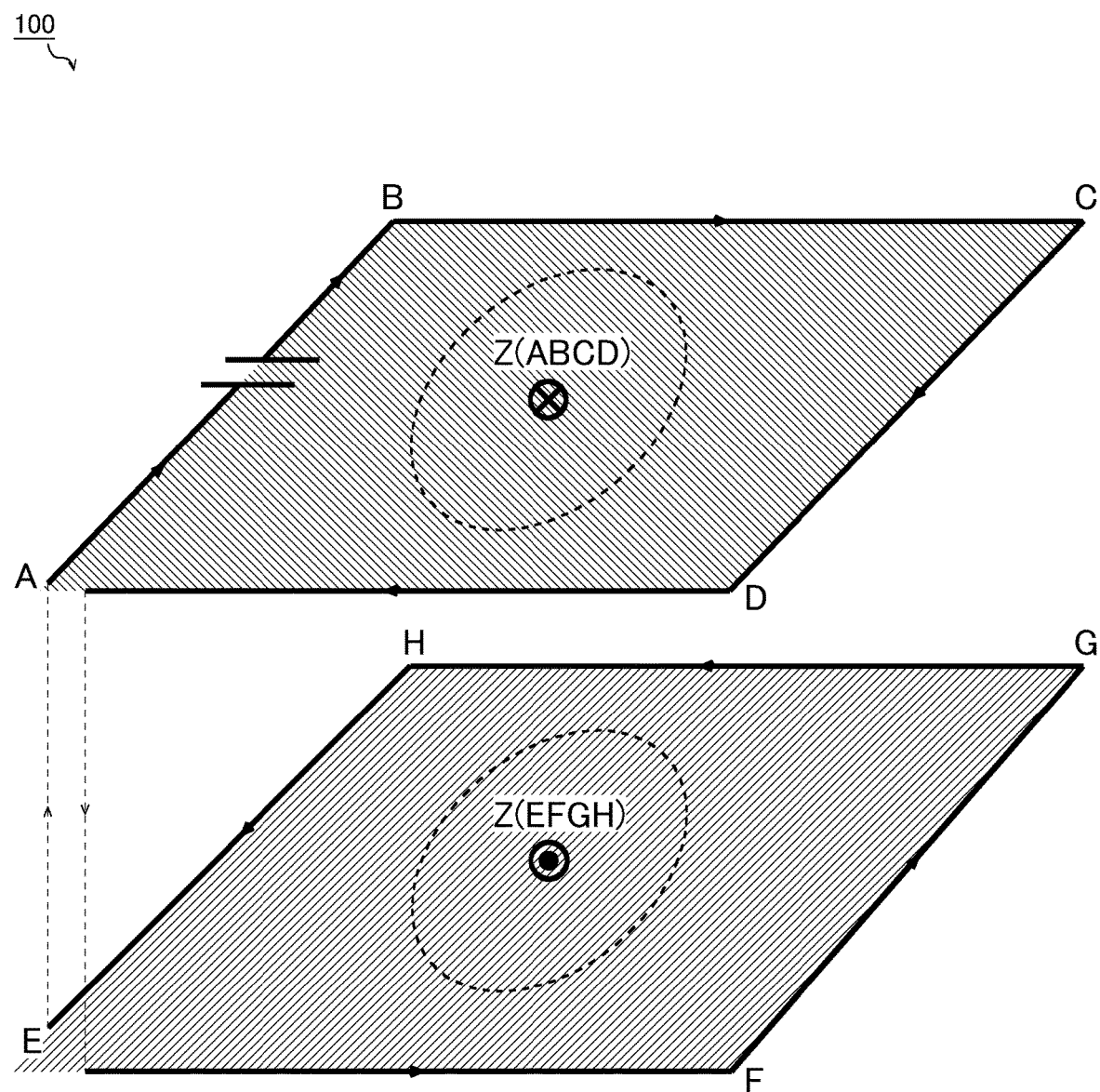
FIG. 12 is a diagram showing a magnetic field canceling effect between faces ABCD and EFGH.

FIG. 12 is a diagram showing the magnetic field canceling effect between faces ABCD and EFGH. At face ABCD, a current flows clockwise across a current path from vertex A to vertex B to vertex C to vertex D to vertex A. Accordingly, at face ABCD, a magnetic field Z(ABCD) that points from top to bottom across the plane of the diagram occurs. On the other hand, at face EFGH, a current flows counter-clockwise across a current path from vertex E to vertex F to vertex G to vertex H to vertex E. Accordingly, at face EFGH, a magnetic field Z(EFGH) that points from bottom to top across the plane of the diagram occurs. As a result, the magnetic fields Z(ABCD) and Z(EFGH) cancel each other. This produces a magnetic field canceling effect between the magnetic fields Z(ABCD) and Z(EFGH).

Figure 13:
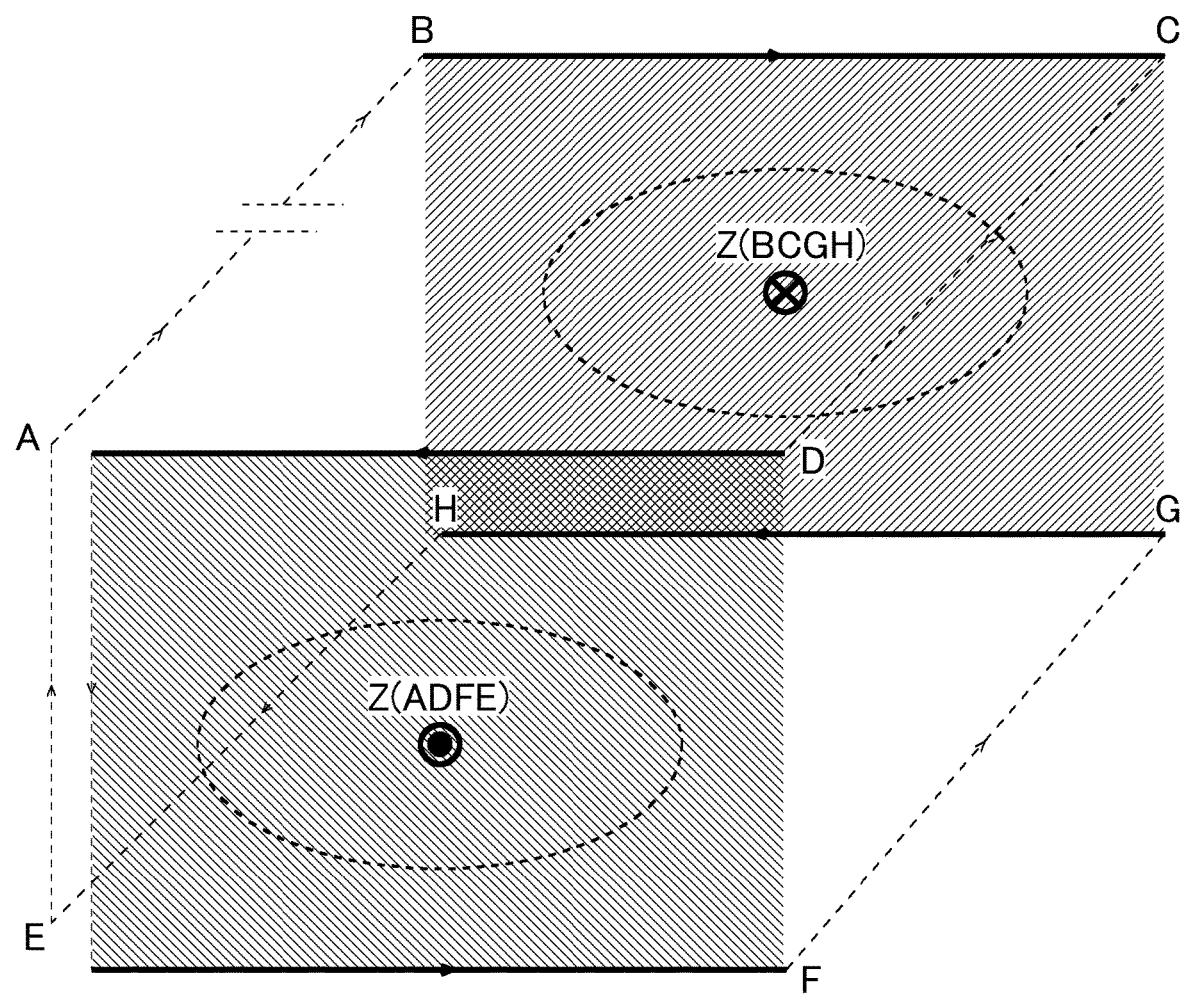
FIG. 13 is a diagram showing a magnetic field canceling effect between faces ADFE and BCGH.

FIG. 13 is a diagram showing the magnetic field canceling effect between faces ADFE and BCGH. At face ADFE, a current that points from vertex D to vertex A and a current that points from vertex E to vertex F flow parallel to each other, one over the other. Accordingly, at face ADFE, a magnetic field Z(ADFE) that points from the far side to the near side of the plane of the diagram occurs. On the other hand, at face BCGH, a current that points from vertex B to vertex C and a current that points from vertex G to vertex H flow parallel to each other, one over the other. Accordingly, at face BCGH, a magnetic field Z(BCGH) that points from the near side to the far side of the plane of the diagram occurs. As a result, the magnetic fields Z(ADFE) and Z(BCGH) cancel each other. This produces a magnetic field canceling effect between faces ADFE and BCGH.

Figure 14:
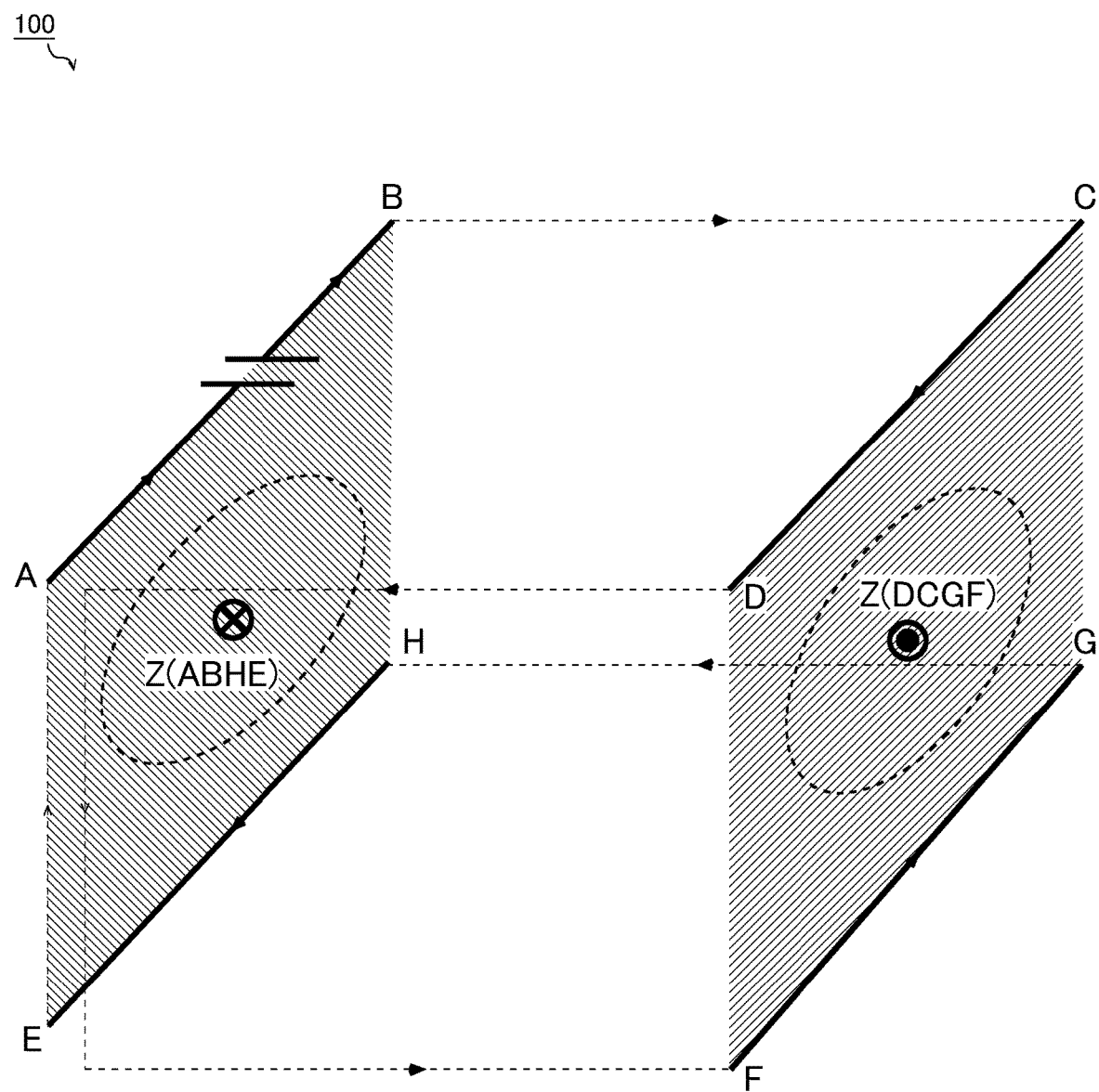
FIG. 14 is a diagram showing a magnetic field canceling effect between faces ABHE and DCGF.

FIG. 14 is a diagram showing the magnetic field canceling effect between faces ABHE and DCGF. At face ABHE, a current that points from vertex A to vertex B and a current that points from vertex H to vertex E flow parallel to each other, one over the other. Accordingly, at face ABHE, a magnetic field Z(ABHE) that points from right to left across the plane of the diagram occurs. On the other hand, at face DCGF, a current that points from vertex C to vertex D and a current that points from vertex F to vertex G flow parallel to each other, one over the other. Accordingly, at face DCGF, a magnetic field Z(DCGF) that points from left to right across the plane of the diagram occurs. As a result, the magnetic fields Z(ABHE) and Z(DCGF) cancel each other. This produces a magnetic field canceling effect between faces ABHE and DCGF.

Figure 17:
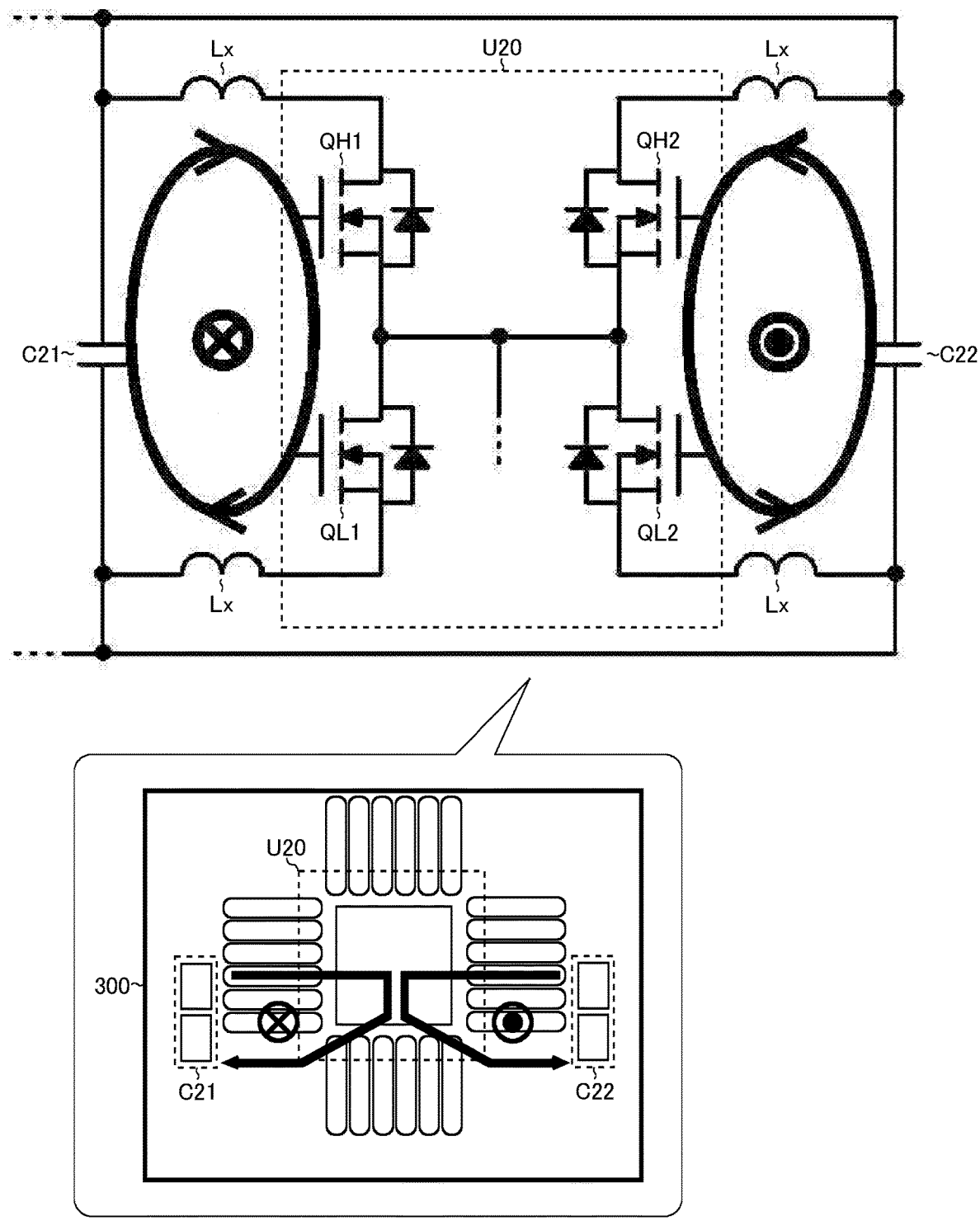
FIG. 17 is a diagram showing a second conventional example of a switching power supply.

As described above, owing to a 3D wiring pattern with a hexahedral structure, it is possible to cancel all the magnetic fields that occur at six faces respectively, and it is thus possible to effectively suppress the EMI radiation noise from the switching power supply 1. Moreover, as opposed to the second conventional example (FIG. 17) described earlier, here, only one bypass capacitor Cb suffices. This helps avoid an unnecessary increase in cost.

The printed circuit board 100 employing the layout described above can be used in switching power supplies in general, and is particularly suitable, it can be said, for vehicle-mounted switching power supplies, which are required to pass strict tests (to comply with, for example, the CISPR25 standard).

Although the above description deals with, as one preferable embodiment that allows one to make the most of a magnetic field canceling effect, a configuration where a printed circuit board 100 has a 3D wiring pattern with a hexahedral structure, this is intended merely to give an ideal example; needless to say, the 3D wiring pattern can be modified in any manner so long as a desired magnetic field canceling effect can be obtained.

Where a more thorough approach against EMI is required, it is possible to make, as desired, modifications such as disposing the bypass capacitor Cb near the semiconductor device 10 and applying spectrum spreading to the driving frequency of the switching output stage (the high-side and low-side switches QH and QL).

Figure 15:
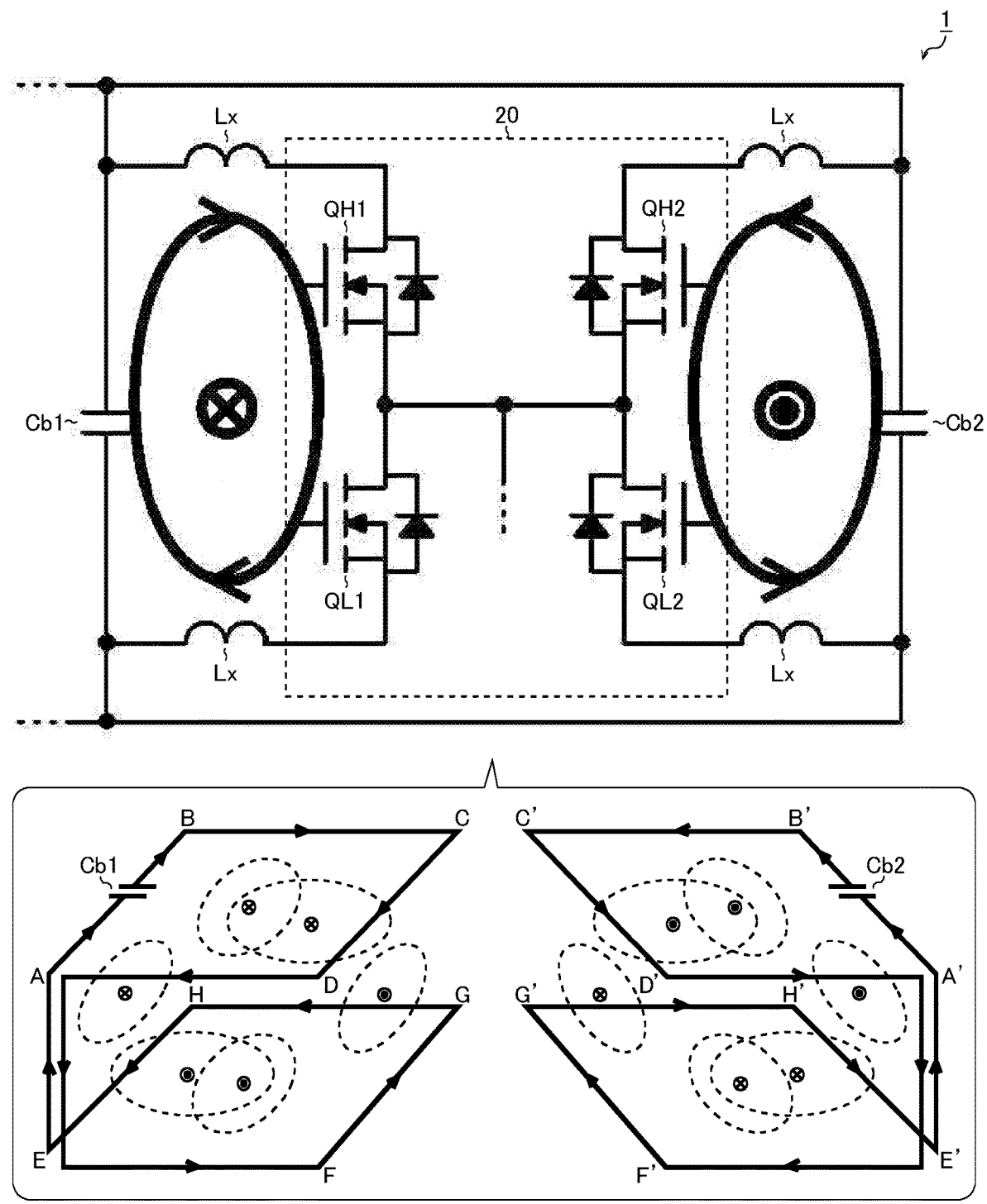
FIG. 15 is a diagram showing a 3D wiring pattern with power MOSFETs each split into two parts.
Figure 16:
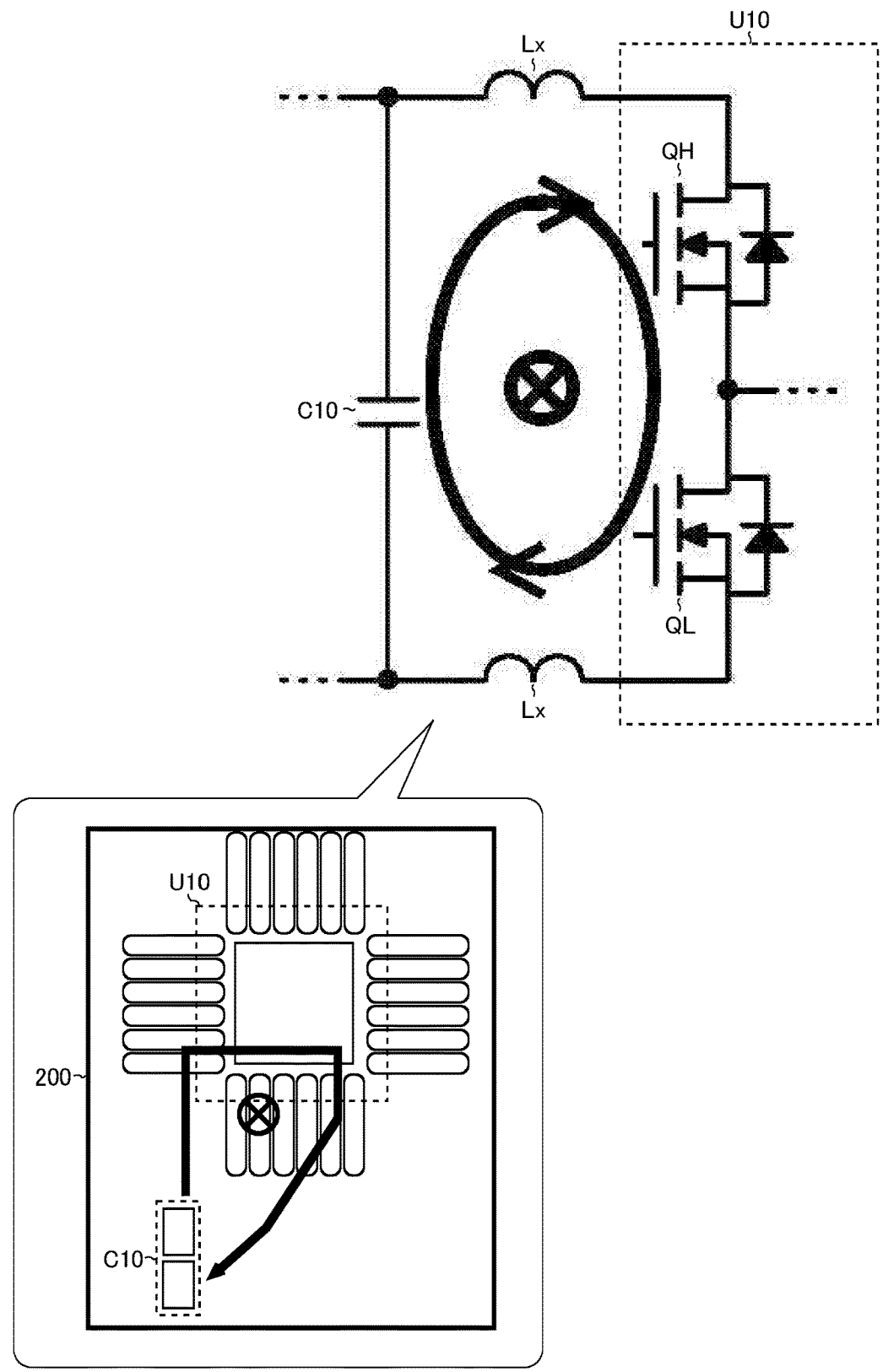
FIG. 16 is a diagram showing a first conventional example of a switching power supply.

Application to Split Power MOSFETs: FIG. 15 is a diagram showing a 3D wiring pattern for configuration where high-side and low-side switches QH and QL are each split into two parts. In the switching power supply 1 shown in the diagram, inside a semiconductor device 20, a high-side switch QH and a low-side switch QL are each split into two parts, namely high-side switches QH1 and QH2 and low-side switches QL1 and QL2 respectively. Thus, in this configuration, the high-side and low-side switches QH and QL each have a reduced AL impedance.

In the switching power supply 1 of this configuration example, as indicated in the balloon in the diagram, by providing one set of the previously described 3D wiring pattern (a first wiring pattern 110, a second wiring pattern 120, a first conductive member 131, and a second conductive member 132) for each of the input loops disposed symmetrically left to right (that is, by providing a total of two such sets), it is possible to obtain a magnetic field canceling effect similar to that described previously.

With the switching power supply 1 of this configuration example, a magnetic field canceling effect is obtained for each of the left and right 3D wiring patterns. Thus, even where the left and right input loops have different sizes, or are located far away from each other, no notable effect appears in the individual magnetic field canceling effects. That is, the switching power supply 1 of this configuration example, as opposed to the second conventional example (FIG. 17) described earlier, is not intended to make deliberate use of the cancelling effect between the magnetic fields occurring in the left and right input loops respectively.

Further Modifications: The various technical features disclosed in the present specification can be implemented in any other ways than as in the embodiment described above, and allow of any modifications without departure from the spirit of the technical ingenuity of the invention.

For example, the type of operation of the switching power supply is not limited to a step-down type; it may instead be a step-up type, a step-up/down type, or an inverting type. The type of rectification of the switching power supply may also be of any type; instead of synchronous rectification, diode rectification may be employed.

Also the type of output feedback control of the switching power supply is not subject to any restriction; it is possible to employ any output feedback control (such as voltage mode control, current mode control, bottom-detecting on-time control, peak-detecting off-time control, or hysteresis control).

Thus, the embodiment described above should be considered to be in every aspect illustrative and not restrictive, and the technical scope of the present invention should be understood to encompass any modifications within the sense and scope equivalent to those of the appended claims.

Industrial Applicability: Switching power supplies according to what is disclosed herein can be used suitably as, for example, vehicle-mounted power supplying means that are required to comply with a strict noise standard.

What is claimed is:

1. A printed circuit board comprising:
   a first wiring pattern; and
   a second wiring pattern,
   wherein
   a first ring-shaped current path is formed across the first wiring pattern,
   a second ring-shaped current path is formed across the second wiring pattern,
   a direction of a current flowing across the first ring-shaped current path and a direction of a current flowing across the second ring-shaped current path are opposite to each other,
   the first and second ring-shaped current paths are located above each other in a thickness direction of the printed circuit board,
   at least part of a first region surrounded by the first ring-shaped current path and at least part of a second region surrounded by the second ring-shaped current path overlap each other as seen in a plan view of the printed circuit board.

2. The printed circuit board according to claim 1, further comprising:
   a first conductive member connected to the first ring-shaped current path, the first conductive member letting a current flow in a first direction pointing from the first ring-shaped current path to the second ring-shaped current path.

3. The printed circuit board according to claim 2, further comprising:
a second conductive member connected to the second ring-shaped current path, the second conductive member letting a current flow in a second direction pointing from the second ring-shaped current path to the first ring-shaped current path.

4. The printed circuit board according to claim 3, wherein the first and second conductive members are located next to each other.

5. The printed circuit board according to claim 1, wherein a capacitor is disposed in at least one of the first and second ring-shaped current paths.

6. The printed circuit board according to claim 1, wherein a switching device is disposed in at least one of the first and second ring-shaped current paths.

7. The printed circuit board according to claim 2, wherein the first conductive member is connected also to the second ring-shaped current path.

8. The printed circuit board according to claim 3, wherein the second conductive member is connected also to the first ring-shaped current path.

9. The printed circuit board according to claim 1, wherein the first and second ring-shaped current paths are both in a shape of an open ring.

10. The printed circuit board according to claim 3, wherein
the first and second conductive members are twisted around each other.

11. The printed circuit board according to claim 3, comprising a plurality of sets each comprising the first wiring pattern, the second wiring pattern, the first conductive member, and the second conductive member.

12. A switching power supply comprising:
the printed circuit board according to claim 1; and
a switching output stage and a bypass capacitor mounted on the printed circuit board to form, along with the first wiring pattern, the first ring-shaped current path.

13. The switching power supply according to claim 12, wherein
the switching output stage is integrated into a semiconductor device.

14. The switching power supply according to claim 13, wherein
the bypass capacitor is disposed near the semiconductor device.

15. The switching power supply according to claim 12, wherein
spectrum spreading is applied to a driving frequency of the switching output stage.

16. An electronic appliance comprising:
the switching power supply according to claim 12; and
a load operating by being supplied with electric power from the switching power supply.

* * * * *